(12) United States Patent
Kuo et al.

(10) Patent No.: US 7,488,434 B2
(45) Date of Patent: Feb. 10, 2009

(54) CONDUCTIVE PASTE FOR CONDUCTIVE SUBSTRATE OR CONDUCTIVE FILM

(75) Inventors: Kuang-Ming Kuo, Taipei (TW); Nelson Tseng, Taipei (TW); Yung-Jen Hsiao, Taipei (TW)

(73) Assignee: Advanced Touch Optics Technology Corporation, Taipei Hsien (TW)

( * ) Notice: Subject to any disclaimer, the term of this patent is extended or adjusted under 35 U.S.C. 154(b) by 10 days.

(21) Appl. No.: 11/785,786

(22) Filed: Apr. 20, 2007

(65) Prior Publication Data

US 2007/0246690 A1   Oct. 25, 2007

(30) Foreign Application Priority Data

Apr. 21, 2006   (TW) ............................. 95114417 A

(51) Int. Cl.
*H01B 1/22* (2006.01)
*B02C 23/00* (2006.01)

(52) U.S. Cl. .................. 252/512; 252/514; 241/23
(58) Field of Classification Search ......... 252/512–514; 366/96; 241/23
See application file for complete search history.

(56) References Cited

U.S. PATENT DOCUMENTS

| | | | | |
|---|---|---|---|---|
| 3,746,662 A | * | 7/1973 | Adelman | ..................... 252/513 |
| 4,425,263 A | * | 1/1984 | Nazarenko | ................... 252/511 |
| 4,592,961 A | * | 6/1986 | Ehrreich | .................... 428/480 |
| 4,595,605 A | * | 6/1986 | Martin et al. | .............. 427/98.4 |
| 5,011,627 A | * | 4/1991 | Lutz et al. | .................... 252/512 |
| 5,089,173 A | * | 2/1992 | Frentzel et al. | ............. 252/514 |
| 5,391,604 A | * | 2/1995 | Dietz et al. | ................. 524/403 |
| 5,653,918 A | * | 8/1997 | Towlson | ..................... 252/514 |
| 5,777,065 A | * | 7/1998 | Ho | .............................. 528/272 |

\* cited by examiner

*Primary Examiner*—Mark Kopec
(74) *Attorney, Agent, or Firm*—Bacon & Thomas, PLLC

(57) ABSTRACT

Membrane switches are manufactured by electrically conductive pastes consisting of 55 to 65% by weight of metal powder in the shape of flake (silver, aluminum, copper or the alloy thereof), 35 to 60% by weight of an organic solvent at high boiling point, 5 to 15% by weight of organic thermal plastic, including mainly saturation polyester polymer, and 0.5 to 5% by weight of additives, including trietheanolamine, adhesion promoter, defoamer, leveling agent, thixotropic agent etc. The silver paste is of excellent adhesion on ITO film or ITO glass, delivers conductivity high up to 20 mΩ/□ with less than 65% by weight of silver, and passes test under the conditions (85□, 85% RH, 1000 hours).

29 Claims, No Drawings

CONDUCTIVE PASTE FOR CONDUCTIVE SUBSTRATE OR CONDUCTIVE FILM

BACKGROUND OF THE INVENTION

1. Field of the Invention

The present invention relates to electrically conductive materials, more particularly, the present invention relates to an electrically conductive paste for conductive substrate or conductive film.

2. Description of Related Arts

The electrically conductive paste is made of low molecular weight liquid epoxy resin and according hardening agent in the U.S. Pat. No. 3,746,662. However, the hardening agent is flaky and hard; it is not applicable to manufacturing membrane keyboards. In the U.S. Pat. No. 4,425,263, the electrically conductive paste is made of metal powder, organic solvent and aromatic polyester resin adhesive. However, the disadvantage of the electrically conductive paste is insufficient flexibility. As a result, the membrane keyboard made of the electrically conductive paste is likely to crack. In order to enhance the flexibility of the electrically conductive paste, polyvinyl dichloride polymer is added to aromatic polyester resin in the U.S. Pat. No. 4,592,961. However, the electrically conductive paste is prone to form gel after kept in storage for a long time. In the U.S. Pat. No. 4,595,605, the soft welding electrically conductive paste is provided, where the electrically conductive paste consists of 88 to 93 wt % by weight of metal powder, and 7 to 12 wt % by weight of plastic vinyl chloride/vinyl ethylene resin polymer with total molecular weight of 14,000 to 35,000. The disadvantage of the electrically conductive paste is that the conductive cannot be attached to indium-tin oxide (ITO) films. In the U.S. Pat. No. 5,011,627, the electrically conductive paste consists of 40 to 75 wt % by weight of metal powder, 5 to 20 wt % by weight of solvent, plastic epoxy resin and phenolic resin (with molecular weight of 10,000 to 25,000). Though the flexibility of the electrically conductive paste is enhanced, but the electrically conductive paste is not as flexible as polyester membrane. In addition, the metal powder used in the electrically conductive paste is spherical, irregular and flake shaped, which delivers less conductivity in the U.S. Pat. No. 5,011,627. In the U.S. Pat. No. 5,089,173, the electrically conductive paste consists of three components polymer plastic vinyl chloride/vinyl ethylene resin/dicaboxylic acid is provided, where the electrically conductive paste consists of 3 to 15 wt % by weight of plastic vinyl chloride/vinyl ethylene resin/dicaboxylic acid and 1 to 6 wt % by weight of polyamide resin, 2 to 10 wt % by weight of polyester alkyd (or 1 to 10 wt % by weight of a mixture of polyamide resin and polyester alkyd), 0.05 to 1.0 wt % by weight of triethanolamine for neutralizing carboxyl group and 50 to 80 wt % by weight of metal powder. The electrically conductive paste is provided for membrane keyboard manufacturing. It should be noted that resin is acidic and therefore may corrode the electronic circuitry. Also, the electrically conductive paste is prone to form gel when the electrically conductive paste is kept in storage for a long time.

In the U.S. Pat. No. 5,653,918, the electrically conductive paste consists of three components polymer, plastic vinyl chloride/vinyl ethylene resin/vinyl alcohol or hydroxyl group, is provided, where the electrically conductive paste consists of 4 to 18 wt % by weight of plastic vinyl chloride/vinyl ethylene resin/vinyl alcohol or hydroxyl group, and 40 to 80 wt % by weight of metal powder. The electrically conductive paste does not have the disadvantage such as gelation, it is not ideal to use in conductive materials such as ITO film or ITO glass.

SUMMARY OF THE INVENTION

Therefore, an object of the invention is to provide a electrically conductive paste for the production of electrically conductive coatings on conductive substrate or conductive thin film, where the plastic chain saturated polyester alkyd is with the molecular weight of 5,000 to 30,000, 0.5 to 2.0 wt % by weight of cyclo-oxgen silane, the adhesive agent, is added for enhance the adhesive capacity, and 5 to 15 wt % by weight of resin is added. The cyclo-oxgen silane, adhesive agent, greatly increases the adhesive strength, as a result, the adhesive strength on ITO film or glass of the present invention is superior to prior art. In addition, the electrically conductive paste delivers satisfying conductive capacity.

Further, the electrically conductive paste of the present invention has conductive metal powder. The conductive metal powder is of circular flake shape and average thickness and diameter. The diameter of a circular flake is controlled within 10 um. Large diameter of a circular flake results in inferior flexibility and adhesive strength. The thickness is controlled within 0.1 to 0.5 μm. Thick layer has less flexibility and delivers higher resistance variation of a bent layer of the electrically conductive paste than thinner layer.

Further, the electrically conductive paste of the present invention is printable on polyester membrane, polycarbonate membrane, polyamide membrane, polyvinyl chloride membrane or ITO cover membrane. A membrane keyboard of high adhesive strength, low resistance and high flexibility is formed after two minutes of 120° C. infra red light process and 20 to 30 minutes of 150° C. baking in a hot blast circulation oven.

Further, the membrane keyboard passes the test under the conditions (85° C., 85% RH, 1000 hours) and functional pressing stress test of 1,000,000 times.

Further, the flake metal powder used in the present invention is selected from the group consisting of Ag, Cu, Al and mixtures and alloys. The tap density is 2.5~4.0 g/cm$^3$, the specific surface area 0.8~1.8 m$^2$/g, the flake diameter is 5 to 15 μm, and the thickness is 0.1 to 0.5 μm.

Further, the plastic chain saturated polyester alkyd used in the present invention is with the molecular weight of 5,000 to 30,000. The plastic chain saturated polyester alkyd used in the present invention has 0.5 to 2.0 wt % by weight of the cyclo-oxgen silane, adhesive agent for enhance the adhesive capacity, and 5 to 15 wt % by weight of resin.

The solvent of the present invention has high boiling point, low vapor pressure and selected from the group consisting of 2,2'-diethylene glycol, 2,2'-ethyl diglycol acetate, isophorone, 1,4-dimethyl adipate, amino acid ethyl esters, dimethyl succinate, 1,4-butyrolactone and 1,2-propanolacetate.

Additives include, modified polysiloxane resin as leveling agent, modified polysiloxane resin as defoamer and polyamide resin as thixotropic agent according to the present invention. The composition of additives is of 0 to 2% by weight.

DETAILED DESCRIPTION OF THE PREFERRED EMBODIMENTS

The electrically conductive paste according to present invention includes 55 to 65% by weight of flake shaped metal powder, 5 to 15% by weight of plastic chain saturated polyester alkyd, 30 to 50% by weight of solvent, 0.5 to 2% by weight of adhesive promoter, and 0 to 5% by weight of additives. The flake shaped metal powder is selected from the group consisting of Ag, Cu, Al and mixtures and alloys thereof. The tap density is 2.5~4.0 g/cm$^3$, the specific surface area is 0.8~1.8 m$^2$/g, the flake diameter is 5 to 15 μm, and the thickness is 0.1 to 0.5 μm. The plastic chain saturated polyester alkyd has the molecular weight of 5,000 to 30,000. The solvent is ketone or ester with high boiling point and low vapor pressure. The solvent is selected from the group consisting of 2,2'-diethylene glycol, 2,2'-ethyl diglycol acetate, isophorone, 1,4-dimethyl adipate, amino acid ethyl esters, dimethyl succinate, 1,4-butyrolactone and 1,2-propanolacetate. The adhesive agent is cyclo-oxgen silane adhesive agent, where one end of the cyclo-oxgen silane adhesive agent has epoxide functional group and the other end has alkoxysilanes functional group. The additives used in an example according to the present invention include leveling agent, defoamer and thixotropic agent. In one example according to the present invention, the leveling agent is modified polysiloxane resin, the defoamer is modified polysiloxane resin and the thixotropic agent is polyamide resin.

The making method of the electrically conductive paste according to the present invention starts with heating the solvent to an average temperature which is about 60 to 80° C. Then the following step is to add the plastic chain saturated polyester alkyd and stir the solution until the plastic chain saturated polyester alkyd is resolved. Then the step moves to adding the adhesive promoter and additives and stirring. The flake shaped metal powder is then added to the solution. The solution is stirred until a particle in the solution having a first average particle size. The first average particle size is less than 15 μm. The last step of the making method is grinding the first average particle with a bead mill until the particle has a second average particle size. The second average particle size is less than 5 μm.

In order that those skilled in the art will be better able to understand the advantages of the electrically conductive paste according to the present invention, the following examples are given by way of illustration, and not by way of limitation.

EXAMPLE 1

Prepare and heat 500 g of 2,2'-ethyl diglycol acetate until the temperature is at 60° C. Then add dynapol L206 into the 2-(2-ethoxyethoxy)ethanol acetate and stir until dynapol L206 is totally dissolved. The solution is named adhesive A.

Prepare a mixture of 165 g adhesive A, 82.8 g 2,2'-ethyl diglycol acetate, 76.74 g 2-(2-ethoxyethoxy)ethanol acetate, 10 g silane adhesive Z-6040 from DEUCHEM CO., LTD, 7.2 g PA-56, and 8.26 g 5300. Stir the mixture until the mixture is thoroughly dispersed. Add silver flake 650 g model no. SF65 from FERRO CO., LTD to the mixture and stir until the silver flake is thoroughly dispersed. Process the mixture with bead mill for 3 to 5 grinding cycles until the fineness is less than 5 um.

Apply the mixture, the silver adhesive coating, through a 250-mesh screen onto ITO polyester membrane or ITO glass. The coating is dried at 120° C. with infra red light for 2 minutes and heated at 150° C. in hot blast circulation oven for 20 to 30 minutes. Then a membrane switch made of ITO film with high adhesive strength and low resistance 8 mΩ/□ is prepared.

EXAMPLE 2

Prepare a mixture of 165 g adhesive A, 82.8 g 2,2'-ethyl diglycol acetate, 126.74 g 2,2'-diethylene glycol, 10.0 g silane adhesive Z-6040 from DEUCHEM CO., LTD and 7.2 g PA-56, and 8.26 g 5300. Stir the mixture until the mixture is thoroughly dispersed. Add silver flake 600 g model no. 9AL from FERRO CO., LTD to the mixture and stir until the silver flake is thoroughly dispersed. Process the mixture with bead mill for 3 to 5 grinding cycles until the fineness is less than 5 μm.

Apply the mixture, the silver adhesive coating, through a 250-mesh screen onto ITO polyester membrane or ITO glass. The coating is dried at 120° C. with infra red light for 2 minutes and heated 150° C. in hot blast circulation oven for 20 to 30 minutes. Then a membrane switch made of ITO film with high adhesive strength and low resistance 12 mΩ/□ is prepared.

EXAMPLE 3

Prepare a mixture of 165 g adhesive A, 132.8 g 2,2'-ethyl diglycol acetate, 126.74 g 2-(2-ethoxyethoxy)ethanol acetate, 10.0 g silane adhesive Z-6040 from DEUCHEM CO., LTD, 7.2 g PA-56, and 8.26 g 5300. Stir the mixture until the mixture is thoroughly dispersed. Add silver flake 550 g model no. 70A from FERRO CO., LTD to the mixture and stir until the silver flake is thoroughly dispersed. Process the mixture with bead mill for 3 to 5 grinding cycles until the fineness is less than 5 um.

Apply the mixture, the silver adhesive coating, through a 250-mesh screen onto ITO polyester membrane or ITO glass. The coating is dried at 120° C. with infra red light for 2 minutes and heated at 150° C. in hot blast circulation oven for 20 to 30 minutes. Then a membrane switch made of ITO film with high adhesive strength and low resistance 18 mΩ/□ is prepared.

COMPARISON EXAMPLE

The electrically conductive paste disclosed in the U.S. Pat. No. 5,011,627 is applied as a comparison example. Adhesive B is prepared by mixing 40% of PKHH (Union Carbide) and 60% of 2,2'-ethyl diglycol acetate. A mixture of 225 g adhesive B, and 600 g silver flakes with tap density of 3.5 g/cm$^3$ is prepared. 175 g 2,2'-ethyl diglycol acetate is added to the mixture and stirred until fully dissolved in the mixture. Process the mixture with three roll mill for 3 to 5 grinding cycles until the fineness is less than 5 μm.

Apply the mixture, the silver adhesive coating, through a 250-mesh screen onto ITO polyester membrane or ITO glass. The coating is dried at 120° C. with infra red light for 2 minutes and heated at 150° C. in hot blast circulation oven for 20 to 30 minutes. Then a membrane switch made of ITO film with high adhesive strength and low resistance 16 mΩ/□ is prepared.

The following chart describes comparison among examples according to the present invention and comparison example.

| Item | Silver Wt % | Surface Resistance | Adhesive Tape Test | 85° C., 85% RH 1000 hour | Performance |
|---|---|---|---|---|---|
| Example 1 | 65% | 8 mΩ/□ | Pass | Pass | Good |
| Example 2 | 60% | 12 mΩ/□ | Pass | Pass | Good |
| Example 3 | 55% | 18 mΩ/□ | Pass | Pass | Excellent |
| Comparison Example | 60% | 16 mΩ/□ | Pass | Pass | Overly high viscosity |

It is apparent that the present invention is superior to the comparison example in terms of silver percentage and performance. The present invention uses less silver and delivers better performance with lower cost and therefore is ideal electrically conductive paste for membrane switch.

Although the description above contains much specificity, it should not be construed as limiting the scope of the invention but as merely providing illustrations of some of the presently preferred embodiments of the present invention. Thus, the scope of the present invention should be determined by the appended claims and their equivalents, rather than by the examples given.

What is claimed is:

1. An electrically conductive paste, comprising:
   55 to 65 wt % by weight of flake shaped metal powder;
   5 to 15 wt % by weight of plastic chain saturated polyester alkyd;
   30 to 50 wt % by weight of solvent;
   0.5 to 2 wt % by weight of adhesive promoter; and
   0 to 5 wt % by weight of additives.

2. The electrically conductive paste of claim 1, wherein the flake shaped metal powder is selected from the group consisting of Ag, Cu, Al and mixtures and alloys thereof, the tap density is 2.5~4.0 g/cm$^3$, the specific surface area is 0.8~1.8 m$^2$/g, the flake diameter is 5 to 15 μm, and the thickness is 0.1 to 0.5 μm.

3. The electrically conductive paste of claim 1, wherein the plastic chain saturated polyester alkyd is with a molecular weight of 5,000 to 30,000.

4. The electrically conductive paste of claim 1, wherein the solvent is ketone or ester with a relatively-high boiling point and a relatively-low vapor pressure.

5. The electrically conductive paste of claim 4, wherein the solvent is selected from the group consisting of 2,2'-diethylene glycol, 2,2'-ethyl diglycol acetate, isophorone, 1,4-dimethyl adipate, amino acid ethyl esters, dimethyl succinate, 1,4-butyrolactone and 1,2-propanolacetate.

6. The electrically conductive paste of claim 1, wherein the adhesive promoter is cyclo-oxgen silane adhesive agent.

7. The electrically conductive paste of claim 6, wherein one end of the cyclo-oxgen silane adhesive agent has epoxide functional group and the other end has alkoxysilanes functional group.

8. The electrically conductive paste of claim 1, wherein the additives comprise leveling agent.

9. The electrically conductive paste of claim 8, wherein the leveling agent is modified polysiloxane resin.

10. The electrically conductive paste of claim 1, wherein the additives comprise defoamer.

11. The electrically conductive paste of claim 10, wherein the defoamer is modified polysiloxane resin.

12. The electrically conductive paste of claim 1, wherein the additives comprise thixotropic agent.

13. The electrically conductive paste of claim 12, wherein the thixotropic agent is polyamide resin.

14. A method of making an electrically conductive paste comprising 55 to 65% by weight of flake shaped metal powder, 5 to 15% by weight of plastic chain saturated polyester alkyd, 30 to 50% by weight of solvent, 0.5 to 2% by weight of adhesive promoter, and 0 to 5% by weight of additives, the method comprising:
   heating the solvent to reach a predetermined temperature;
   adding the plastic chain saturated polyester alkyd and stirring until the plastic chain saturated polyester alkyd being resolved;
   adding the adhesive promoter and additives and stirring;
   adding the flake shaped metal powder, stirring the solution until a particle having a first average particle size; and
   grinding the particle having a first average particle size until the particle having a second average particle size;
   wherein the first average particle size is larger than the second average particle size.

15. The making method of claim 14, wherein the flake shaped metal powder is selected from the group consisting of Ag, Cu, Al and mixtures and alloys thereof, the tap density is 2.5~4.0 g/cm$^3$, specific surface area 0.8~1.8 m$^2$/g, flake diameter is 5 to 15 μm, and thickness is 0.1 to 0.5 μm.

16. The making method of claim 14, wherein the plastic chain saturated polyester alkyd is with a molecular weight of 5,000 to 30,000.

17. The making method of claim 14, wherein the solvent is a ketone or ester with a relatively-high boiling point and a relatively-low vapor pressure.

18. The making method of claim 17, Wherein the solvent is selected from the group consisting of 2,2'-diethylene glycol, 2,2'-ethyl diglycol acetate, isophorone, 1,4-dimethyl adipate, amino acid ethyl esters, dimethyl succinate, 1,4-butyrolactone and 1,2-propanolacetate.

19. The making method of claim 14, wherein the adhesive promoter is cyclo-oxgen silane adhesive agent.

20. The making method of claim 19, wherein one end of the cyclo-oxgen silane adhesive agent has epoxide functional group and the other end has alkoxysilanes functional group.

21. The making method of claim 14, wherein the additives comprise leveling agent.

22. The making method of claim 21, wherein the leveling agent is modified polysiloxane resin.

23. The making method of claim 14, wherein the additives comprise defoamer.

24. The making method of claim 23, wherein the defoamer is modified polysiloxane resin.

25. The making method of claim 14, wherein the additives comprise thixotropic agent.

26. The making method of claim 25, wherein the thixotropic agent is polyamide resin.

27. The making method of claim 14, wherein the predetermined temperature is 60° C.~80° C.

28. The making method of claim 14, wherein the first average particle size is less than 15 μm.

29. The making method of claim 14, wherein the second average particle size is less than 5 μm.

* * * * *